(12) United States Patent
Frangeskou et al.

(10) Patent No.: US 11,852,701 B2
(45) Date of Patent: Dec. 26, 2023

(54) DEFECT CENTRE-BASED SENSOR

(71) Applicant: The University of Warwick, Coventry (GB)

(72) Inventors: Angelo Frangeskou, Coventry (GB); Gavin Morley, Coventry (GB); Ben Green, Coventry (GB); Ben Breeze, Coventry (GB); Matthew Dale, Coventry (GB); Rajesh Patel, Coventry (GB)

(73) Assignee: The University of Warwick, Coventry (GB)

( * ) Notice: Subject to any disclaimer, the term of this patent is extended or adjusted under 35 U.S.C. 154(b) by 310 days.

(21) Appl. No.: 17/427,127

(22) PCT Filed: Jan. 29, 2020

(86) PCT No.: PCT/GB2020/050207
§ 371 (c)(1),
(2) Date: Jul. 30, 2021

(87) PCT Pub. No.: WO2020/157497
PCT Pub. Date: Aug. 6, 2020

(65) Prior Publication Data
US 2022/0146605 A1 May 12, 2022

(30) Foreign Application Priority Data
Jan. 30, 2019 (GB) ...................................... 1901277

(51) Int. Cl.
*G01V 3/00* (2006.01)
*G01R 33/24* (2006.01)
(Continued)

(52) U.S. Cl.
CPC ........... *G01R 33/24* (2013.01); *G01R 33/445* (2013.01); *G02B 6/32* (2013.01); *G02B 6/4204* (2013.01)

(58) Field of Classification Search
CPC ........ G01R 33/24; G01R 33/445; G02B 6/32; G02B 6/4204
(Continued)

(56) References Cited

U.S. PATENT DOCUMENTS

2014/0291490 A1   10/2014   Hanson et al.

FOREIGN PATENT DOCUMENTS

CN           109143121 A       1/2019

OTHER PUBLICATIONS

WIPO, International Preliminary Report on Patentability for corresponding International Patent Application No. PCT/GB2020/050207, dated Jul. 27, 2021, 9 pages.
(Continued)

*Primary Examiner* — Walter L Lindsay, Jr.
(74) *Attorney, Agent, or Firm* — NK Patent Law

(57) ABSTRACT

A defect centre-based sensor is disclosed. The sensor comprises instrumentation which includes a generator for causing excitation in an active element, for example a diamond, and a detector for measuring a transition in the active element. The generator is an optical source and/or the detector is an optical detector. The sensor further comprises an optical waveguide and a sensor head in communication with the source and/or the detector via the optical waveguide. The sensor head houses the active element having at least one defect centre, for example, a nitrogen vacancy, responsive to an applied magnetic field, electric field or temperature and a signal delivery arrangement, for example at least one lens, arranged to optically couple the optical waveguide to the active element.

20 Claims, 6 Drawing Sheets

(51) Int. Cl.
*G01R 33/44* (2006.01)
*G02B 6/32* (2006.01)
*G02B 6/42* (2006.01)

(58) Field of Classification Search
USPC .......................................................... 324/301
See application file for complete search history.

(56) References Cited

OTHER PUBLICATIONS

Fedotov, I. V. et al.: "Electron spin manipulation and readout through an optical fiber", Scientific Reports, vol. 4, No. 5362, Jul. 16, 2014, pp. 1-6.

Liu, Xiaodi et al.: "Fiber-integrated diamond-based magnetometer", Applied Physics Letters, vol. 103, 143105, Sep. 30, 2013, 4 pages.

Fujiwara, Masazumi et al.: "Manipulation of single nanodiamonds to ultrathin fiber-taper nanofibers and control of NV-spin states toward fiber-integrated Λ-systems", Nanotechnology, vol. 27, 455202, Oct. 7, 2016, 8 pages.

Stürner, Felix M. et al.: "Compact integrated magnetometer based on nitrogen-vacancy centres in diamond", Diamond & Related Materials, vol. 93, Jan. 17, 2019, pp. 59-65.

Blakley S. M. et al.: "Fiber-optic vectorial magnetic-field gradiometry by a spatiotemporal differential optical detection of magnetic resonance in nitrogen-vacancy centers in diamond", Optics Letters, vol. 41, No. 9, May 1, 2016, pp. 2057-2061.

UKIPO, Combined Search and Examination Report for corresponding GB Patent Application No. 1901277.2, dated Jul. 5, 2019, 9 pages.

Duan, Dewen et al.: Enhancing fluorescence excitation and collection from the nitrogen-vacancy center in diamond through a micro-concave mirror, Arxiv.Org, Cornell University Library, 201 Olin Library Cornell University Ithaca, NY 14853, Apr. 12, 2018, pp. 1-6.

Wickenbrock, Arne et al.: "Microwave-free magnetometry with nitrogen-vacancy centers in diamond", Arxiv.Org, Cornell University Library, 201 Olin Library Cornell University Ithaca, NY 14853, Jun. 9, 2016, pp. 1-5.

ISA/EP, International Search Report and Written Opinion for corresponding International Patent Application No. PCT/GB2020/050207, dated Apr. 8, 2020, 15 pages.

Rondin, L. et al.: "Magnetometry with nitrogen-vacancy defects in diamond", Reports on Progress in Physics, vol. 77, No. 5, 056503, May 6, 2014, pp. 1-29.

DEFECT CENTRE-BASED SENSOR

CROSS REFERENCE TO RELATED APPLICATIONS

This application is a U.S. National Stage Application of International Patent Application No. PCT/GB2020/050207 filed on Jan. 29, 2020, which claims priority to United Kingdom Patent Application No. 1901277.2 filed on Jan. 30, 2019, the entire content of all of which is incorporated by reference herein.

FIELD

The present invention relates to a defect centre-based sensor, such as a magnetometer, electrometer or thermometer, in particular to a nitrogen-vacancy centre in diamond sensor which can be used as a magnetometer.

BACKGROUND

A magnetometer which employs nitrogen-vacancy (NV) defects in diamond can be used as a sensor to detect weak magnetic fields. In many applications, it is desirable to have a remote, mobile sensor head and separate instrumentation. The sensor and instrumentation may be connected via an optical fibre or through free space. Fibre-coupled NV-diamond based magnetometers having sensitives up to 30 nT/√Hz have been demonstrated, whereas free space versions have achieved sensitives of 15 pT/√Hz for d.c. fields and 0.9 pT/√Hz for a.c. fields.

A review of magnetometry using nitrogen-vacancy defects in diamond is given by L. Rondin et al. "Magnetometry with nitrogen-vacancy defects in diamond", Reports on Progress in Physics, volume 88, page 056503 (2014).

Reference is made to S. M. Blakley et al.: "Fiber-optic vectorial magnetic-field gradiometry by a spatiotemporal differential optical detection of magnetic resonance in nitrogen-vacancy centers in diamond, Optics Letters, volume 41, pages 2057 to 2060 (2016), J. F. Barry et al.: "Optical magnetic detection of single-neuron action potentials using quantum defects in diamond", Proceedings of the National Academy of Sciences of the United States of America, volume 113, pages 14133 to 14138 (2016) and T. Wolf et al.: "Subpicotesla Diamond Magnetometry", Physical Review X, volume 5, page 041001 (2015).

SUMMARY

According to a first aspect of the present invention there is provided a sensor comprising instrumentation which includes a generator for causing excitation (such as photoexcitation) in an active element (for example, a diamond) and a detector for measuring a transition (such as fluorescence) in the active element. The generator is an optical source (such as a laser in the form of a diode laser) and/or the detector is an optical detector (such as a diode photodetector). The sensor further comprises an optical waveguide (such as an optical fibre) and a sensor head in communication with the source and/or the detector via the optical waveguide. The sensor head houses the active element having at least one defect centre (such as a nitrogen vacancy) and a signal delivery arrangement (such as one or more lenses) arranged to optically couple the optical waveguide to the active element.

The at least one defect centre may be responsive to an applied magnetic field, electric field and/or temperature. Thus, the sensor may be used as a magnetometer, electrometer and/or thermometer.

The sensor may be arranged to excite and to measure a plurality of defect centres, i.e., an ensemble of defect centres.

The sensor head may be mobile or fixed. The sensor head may be remote from the instrumentation (for example, spaced apart by at least 1 m, at least 10 m or at least 1 km).

Preferably both the source and detector are optical, i.e., the source is an optical source and the detector is an optical detector.

The magnetometer can transmit light using both an optical waveguide and free-space. Using the same signal delivery system (e.g., a set of lenses) for both excitation and collection can provide a higher excitation intensity and/or can allow a smaller active element to be used which in turn can increase spatial resolution as well as reducing the amount of diamond material required. The signal delivery system can also help to couple fluorescence into the optical waveguide and therefore increase sensitivity. The arrangement can achieve higher numerical aperture on detection of the signal relative to the numerical aperture of the excitation despite using the same signal delivery system for both, allowing a larger volume to be excited whilst maintaining good collection efficiency.

The signal delivery arrangement preferably comprises at least one lens and, more preferably two or more lenses. A lens may be a transmissive lens (this type of lens is colloquially referred to simply as a "lens"), a mirror lens or a grating lens. If more than one lens is used, then the lenses may be all of the same type or may be a mixture of lenses of two or more different types.

The signal delivery arrangement may be omitted, i.e., the optical waveguide may be directly coupled to the active element. An optically-transparent adhesive may be used.

The at least one lens may comprise at least two lenses including a first lens for collimating light from the optical waveguide and a second lens for focusing light onto the active element.

The active element may have a surface arranged to receive light from the at least one lens and other surfaces, at least some of the other surfaces provided with a reflective structure for retro-reflecting unabsorbed light. The surface may be provided with a reflective structure around a peripheral edge of the surface to define a central window. The reflective structure comprises a coating. The coating may comprise a metallic coating. The coating may include one, two, three or more layers. The coating may include a layer of titanium. The coating may include a layer of silver. The coating may include a layer of gold. The reflective structure comprises a grating.

The sensor may further comprise a solid immersion lens in direct contact with or formed in a single piece with the active element arranged to couple light from the at least one lens into the active element.

The optical waveguide may be an optical fibre. The optical fibre may be a hollow-core optical fibre.

The sensor may further comprise a microwave source arranged to excite the active element. If the sensor head is remotely located from the instrumentation, then the microwave source may be provided locally to the sensor head. The microwave source may be powered by a local power source or by a remote power source. The microwave source may be remote from the sensor head, with a microwave cable used to bring the microwave excitation to the active element.

The sensor may further comprise a lock-in amplifier arranged to receive a signal from the optical detector. This can be used for a continuous wave measurement.

The sensor may be configured to operate in pulsed mode operation.

According to a second aspect of the present invention there is provided a defect centre based sensor imaging system. The system comprises instrumentation which includes at least one generator for causing excitation in an active element, and at least one detector for measuring a transition in the active element, wherein the at least one generator is (are) optical source(s) and/or the at least one detector is (are) optical detector(s), at least one optical waveguide, and a sensor head in communication with the source(s) and/or the detector(s) via the optical waveguide(s). The sensor head houses an array of active element or an array of regions in an active element having at least one defect centre responsive to an applied magnetic field and at least one signal delivery arrangement arranged to optically couple the optical waveguide(s) to the active element(s).

The at least one defect centre may be responsive to an applied magnetic field, electric field and/or temperature. Thus, the imaging system may be used for magnetometry, electrometry and/or thermometry imaging.

According to a third aspect of the present invention there is provided an article incorporating the sensor head of the sensor or the imaging system.

The article may be a piece of furniture, such as seat, chair or bed, a removable part of a piece of furniture, such as a cushion, mattress or sheet, a wall or door, a camera, an accessory, such as a watch or jewelry, or communications device, such as a mobile phone or tablet computer. The article may be a piece of clothing or medical dressing.

According to a fourth aspect of the present invention there is provided a method of using the sensor or the imaging system, the method comprising deploying the sensor head in a location which is remote from the instrumentation.

The location may be subject to ionizing radiation greater than 50 mSv per year. The location may be a magnetically-shielded room.

According to a fourth aspect of the present invention there is provided a method of magnetic induction tomography, the method comprising applying a time-varying magnetic field to a sample and measuring an induced response from the sample using the sensor.

Optical radiation has a range between 100 nm and 1 mm (i.e. including UVA, UVB and UVC ultraviolet wavelengths and infrared wavelengths). Preferably, excitation and fluorescence occur in a range between 200 nm to 2 μm and, more preferably between 400 nm and 1.1 μm. For example, the range may be between 530 nm and 800 nm.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
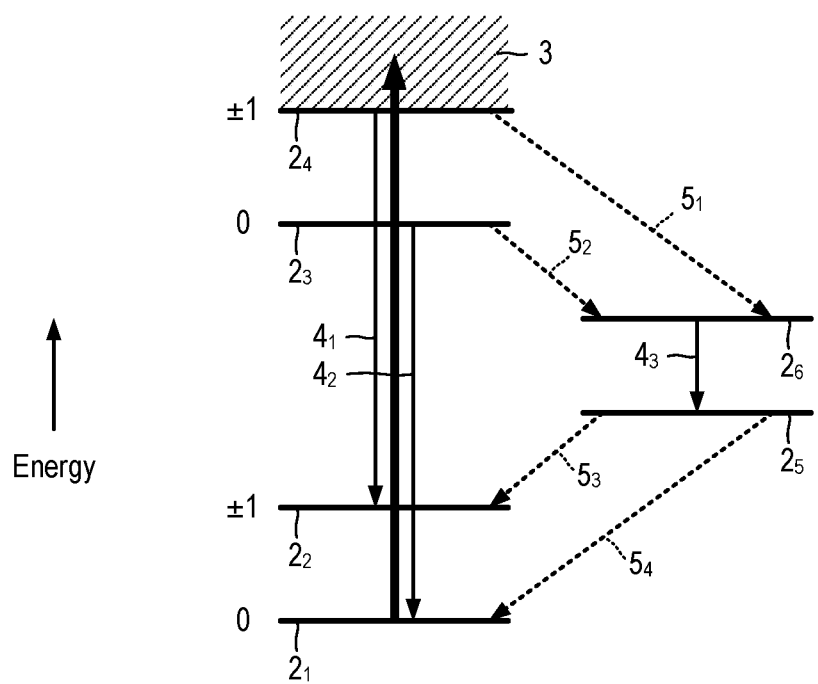
FIG. 1 is an energy level diagram of a nitrogen-vacancy centre in diamond showing spin quantum number, vibronic levels, spin-conserving transitions and non-radiative, non-spin conserving transitions.

In the following description, like parts are denoted by like reference numerals.

Introduction

Magnetic sensing can be implemented by probing an ensemble of nitrogen-vacancy (NV) centres in diamond.

FIG. 1 is an energy level diagram of a nitrogen-vacancy centre 1 in diamond showing energy levels $2_1$, $2_2$, $2_3$, $2_4$, $2_5$, $2_6$ and their corresponding spin quantum number, vibronic levels 3, spin-conserving transitions $4_1$, $4_2$, $4_3$ and non-radiative, non-spin conserving $5_1$, $5_2$, $5_3$, $5_4$.

Referring to FIG. 1, an NV centre 1 is an optically-active point defect in diamond containing an S=1 ground-state electron spin in its negative charge state, NV$^-$. The spin can be initialised by optical pumping into the $m_s$=0 ground-state manifold, and optical excitation also yields a spin dependent fluorescence intensity, leading to the possibility of optically detected magnetic resonance (ODMR). The combination of optical pumping with ODMR leads to a protocol for high signal-to-noise detection of electron Zeeman resonances in the NV$^-$ centre. Whilst traditional electron spin resonance methods have a sensitivity of approximately $\geq 10^9$ spins, a single spin can be detected with ODMR. The sensitivity improves as $1/\sqrt{N}$ for an ensemble of N centres.

In zero-applied magnetic field, the 0 and ±1 states are split by the zero-field splitting D≈2.87 GHz. The Zeeman sub-levels split as $\gamma_e B_\|$, where $\gamma_e = g_e \mu_B/\hbar \approx 2\pi \times 28$ MHz/mT is the gyromagnetic ratio, $B_\|$ is the projection of the external magnetic field onto the NV$^-$ symmetry axis (the <111> crystallographic direction), $g_e \approx 2$ is the NV$^-$ g-factor, $\mu_B$ is the Bohr magneton, and $\hbar$ is the reduced Planck constant. The energy levels are further split by the hyperfine interaction between the electron spin and $^{14}$N nuclear spin (I=1) by A≈2.16 MHz. The NV centre has an NIR transition $4_3$ at 1042 nm.

Other defects in diamond may be used which lie in the near-infrared, such as the silicon-vacancy. Negative or neutral charge states can be used which photoluminesce at 740 and 946 nm respectively.

Other types of defect, such as colour centres, and/or other materials, such as silicon carbide, can be used. Preferably, the material is single crystal, although polycrystalline or nanocrystalline material can be used.

Measurement

Figure 2:
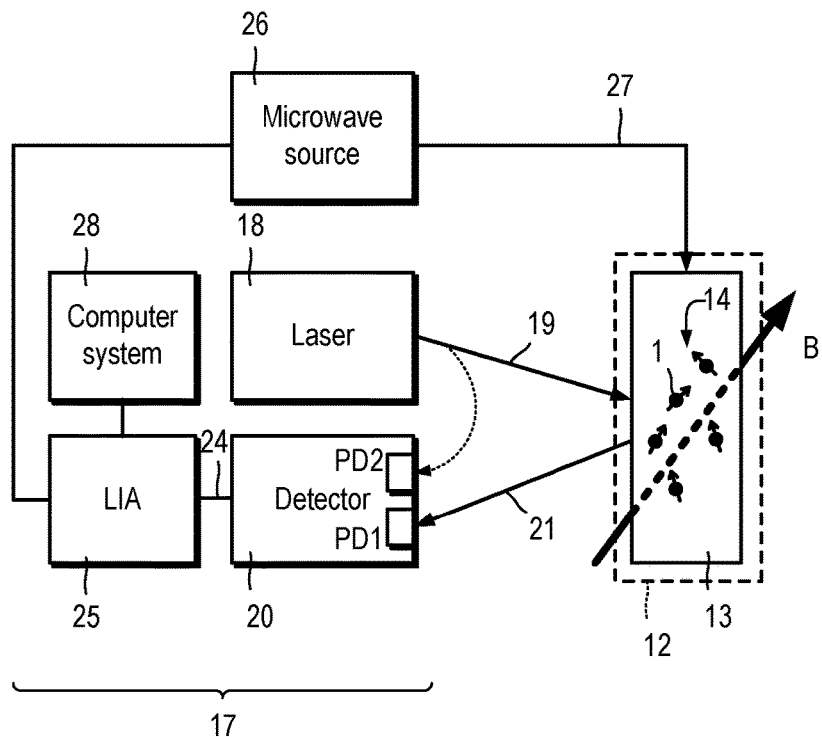
FIG. 2 is a schematic block diagram of a nitrogen-vacancy centre-based sensor including a sensor head, an optical fibre and instrumentation.

FIG. 2 shows a sensor system 11 (herein referred to simply as a "sensor") is shown.

Figure 3:
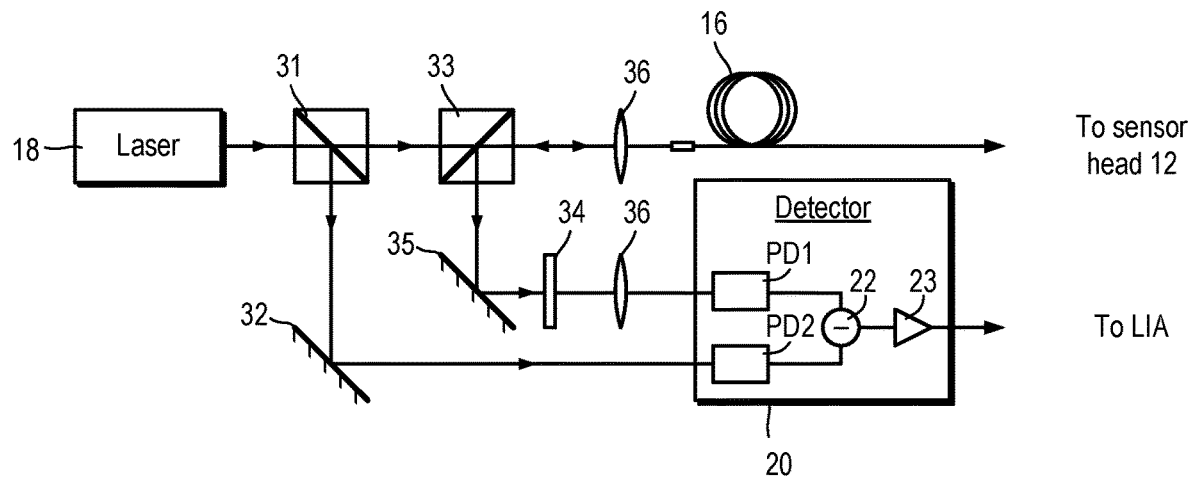
FIG. 3 illustrates in more detail the instrumentation and the optical fibre shown in FIG. 2.

Referring FIG. 2 and also to FIG. 3, the system 11 includes a sensor head 12 which houses an active element 13 containing an ensemble 14 of defect centres 1 which in this case takes the form of diamond having NV$^-$ centres, and a signal delivery arrangement 15 (FIG. 5) which takes the form of a pair of lenses. The system 11 includes a waveguide 16, in particular an optical waveguide, in the form of an optical fibre. The system 11 also includes instrumentation 17 including a signal source 18 for generating an excitation signal 19 for exciting the active element 13 and a signal detector 20 for measuring a response signal 21 received from the active element. As will be explained in more detail, one or both signals 19, 21 are optical signals. In this case, a laser and photodiodes are used.

The signal detector 20 may be arranged to carry out a differential measurement and include first and second detector elements PD1, PD2 and output a signal 24. The instrumentation 17 may include a lock-in amplifier 25 which receives the output signal 24. The instrumentation 17 may include a microwave source 25 for generating a microwave signal 26 which is emitted by a microwave delivery structure 27. The system 11 is controlled by a computer system 28.

The ensemble 14 of NV⁻ centres 1 in diamond 13 is excited with non-resonant 532 nm laser light 19 from the laser 18 (although light having a wavelength in a range between 510 to 540 nm may be used), and broadband fluorescence 21 is emitted from the zero-phonon line at 637 nm and up to 800 nm emanating from the phonon sideband. Decay from the $m_s = \pm 1$ manifolds of the excited-state is more likely to occur through an intersystem crossing which preferentially populates the $m_s = 0$ manifold of the ground-state, resulting in spin polarisation. The decay through this intersystem crossing is also non-radiative in the visible range, resulting in a characteristic reduction in NV⁻ fluorescence when microwaves are resonant with the ground- or excited-state electron spin transitions.

Fluorescence 21 is detected by the first photodiode PD1 of the detector 29. A balanced detector is used in the form of a Thorlabs PDB450A. Approximately 1% of the laser light 19 is picked off from the main beam by a beam splitter 31 to illuminate a second photodiode PD2 via mirror 32. A dichroic mirror 33 is used to separate green excitation light 19 from the red florescence light 21. A neutral density filter 34 is used to ensure the illumination levels are the same on each photodiode PD1, PD2 in the absence of microwave excitation. A subtractor 22 is used to take the difference of the two signals 19, 21 and the difference is fed into an amplifier 23. The output of the balanced detector 21 is the difference of the two signals 19, 21 amplified with a gain of $10^5$, providing common-mode noise rejection between the laser and fluorescence of up to 20 dB.

Microwave excitation 27 is frequency modulated (FM) at $f_{mod} = 48$ kHz with an amplitude $f_{dev} = 400$ kHz, generated by a microwave source 16 in the form of an Agilent N5172B microwave source. This leads to the balanced detector 21 signal being amplitude modulated at $f_{mod}$ when the microwave excitation is resonant with a spin transition. The balanced detector signal 20 is detected on a Zurich Instruments MFLI lock-in amplifier (LIA) 25 with a time constant of 50 μs and a 48 dB/octave filter slope, resulting in a magnetometry bandwidth $f^{BW}_{3dB} = 1$ kHz.

Figure 4:
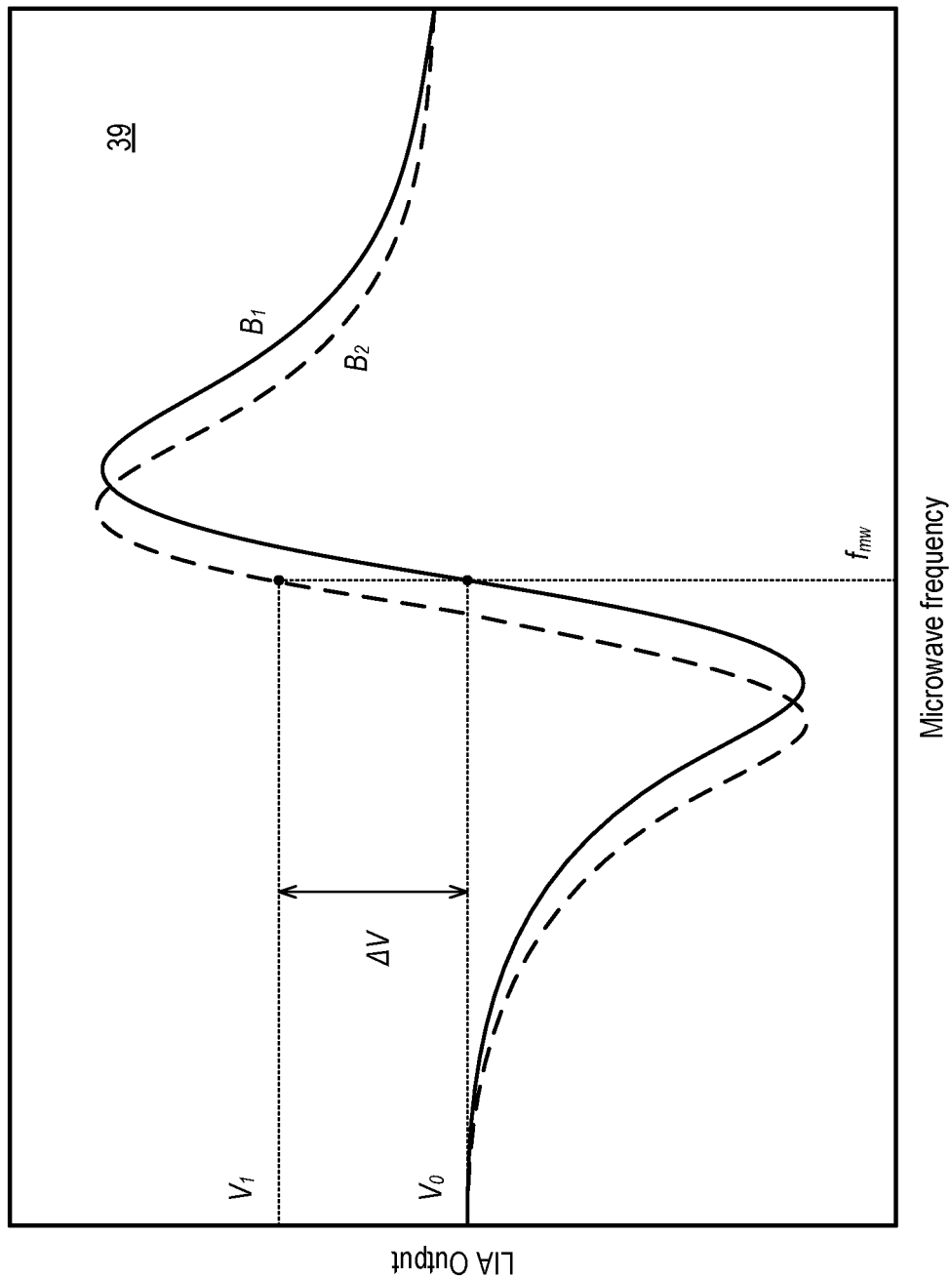
FIG. 4 shows an optically detected magnetic resonance plot at first and second magnetic fields.

Referring to FIG. 4, when sweeping the microwave frequency, an ODMR spectrum 39 is obtained with derivative line shapes as a result of the frequency modulation and LIA detection.

An optimal operation point is where the microwave frequency is fixed to the maximal slope of the Zeeman resonance, which for a derivative line-shape is the zero-crossing at the resonant frequency. Here, the sensor response is linear over a range $\hbar \gamma_{FWHM}/g_e \mu_B \approx 0.05$ mT, where $\gamma_{FWHM} \approx 2\pi \times 1$ MHz is the full-width at half-maximum linewidth of the resonance. The linearity can be extended substantially by dynamically locking to the resonance, which also negates temperature drift A change in the magnetic field B causes the ODMR resonance (solid line) to shift resulting in shifted ODMR resonance (dashed line). A fixed microwave excitation frequency of $f_{mw}$ produces an output signal from the LIA of $V_0$, which increases to $V_1$ as the resonance shifts, causing a change in the LIA output signal of $\Delta V = V_1 - V_0$.

Sample

The sample 13 is a single-crystal high-pressure high-temperature (HPHT) synthesised diamond (obtained from Element Six). The sample 13 was first electron irradiated, followed by annealing under a nitrogen ambient (buried in a sacrificial diamond grit) for four hours at 400° C., two hours at 800° C., and two hours at 1200° C. After exposure to UV light, the sample's defect concentrations were measured by a combination of electron paramagnetic resonance (EPR) and Fourier transform infrared spectroscopy (FTIR), summarised in Table I below.

TABLE 1

| [NV⁻] (ppm) | [NV⁰] (ppm) | [N⁰s] (ppm) | [N⁺s] (ppm) | Linewidth (MHz) |
|---|---|---|---|---|
| 1.2† | 1.1‡ | 6.0 | 1.0† | 1.2†† |

†Measured by EPR
‡Measured by FTIR
††Measured by ODMR

The concentration of nitrogen vacancies, NV⁻, lies in a range between 1 part-per-trillion (ppt) to 100 parts-per-million. The concentration of nitrogen vacancies, NV⁻, preferably lies in a range between 10 part-per-billion (ppb) to 50 ppm and more preferably between 100 ppb and 10 ppm. For these ranges, there are expected to be typically between 2 to 500 times more single substitutional nitrogen impurities present. A lower concentration (e.g., less than 1 ppt) of nitrogen vacancies, NV⁻, can be used, which can be employed for a single NV based sensor.

In some embodiments which use non-isotopically enriched diamond, the concentration of nitrogen vacancies, NV⁻, preferably lies in a range between 0.5 and 2 ppm and the concentration of single substitutional nitrogen, $N_S$, lies in a range 1 to 10 ppm. This combination of ranges can help to increase signal (due to a higher NV concentration) but not so high that dipolar interactions broaden out ODMR resonances. Broader lines lead to lower change in voltage for a given change in magnetic field. For single substitutional nitrogen, $N_S$ concentration below about 1 to 10 ppm, resonance linewidth is limited by the fact that 1.1% of the carbon atoms are ¹³C which has a nuclear spin. If ¹²C-enriched diamond is used, then this can allow slightly lower concentrations to be used.

Sensor

Figure 5:
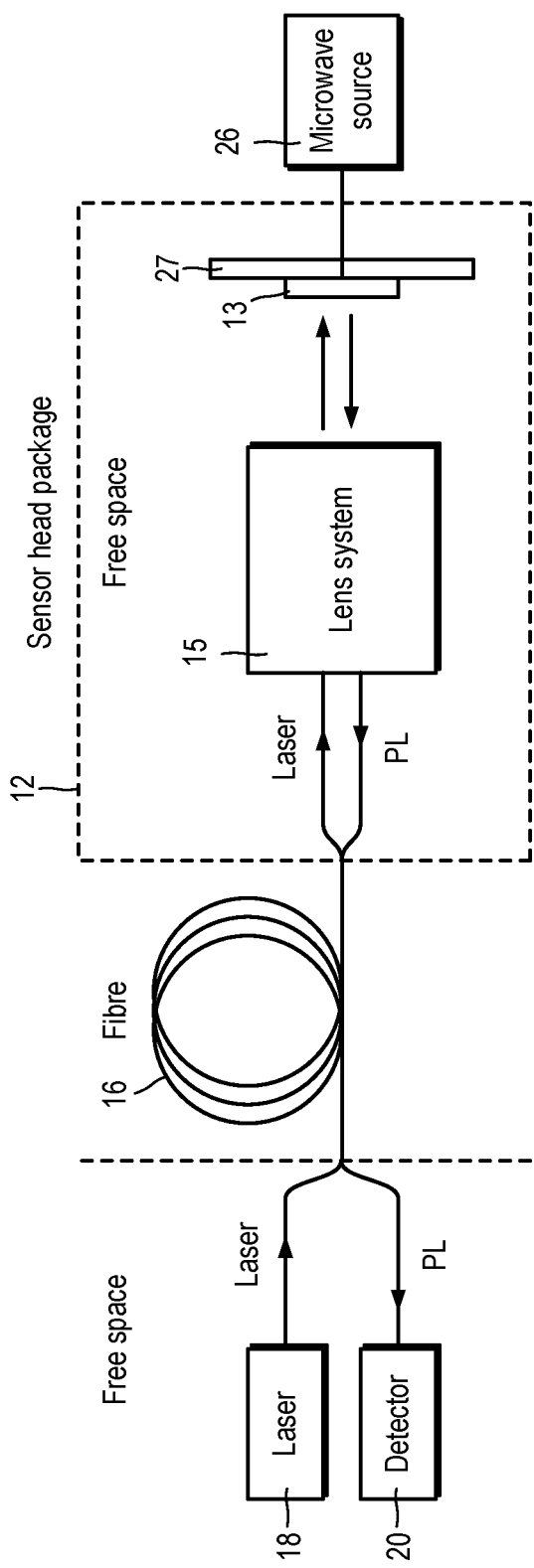
FIG. 5 illustrates arrangement of laser, detector, optical fibre and sensor head.
Figure 6:
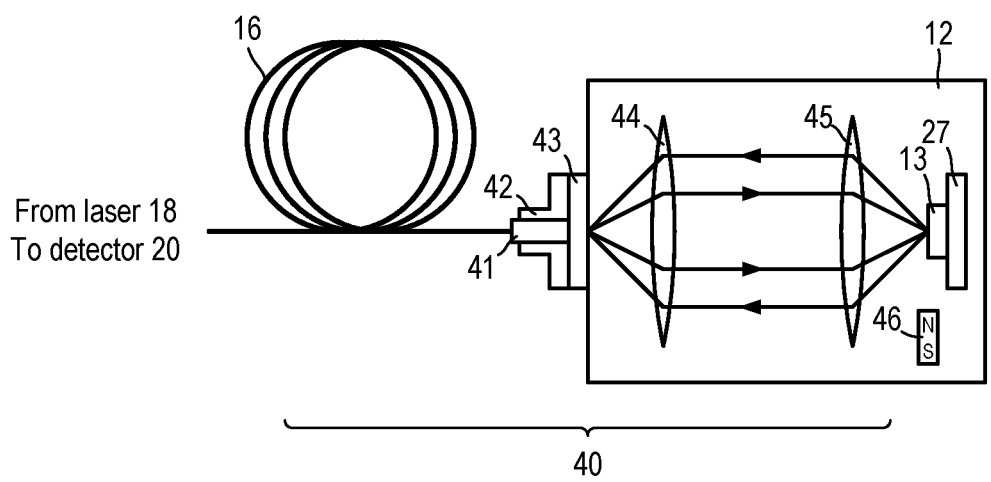
FIG. 6 illustrates in more detail the sensor head shown in FIG. 5.

Referring to FIGS. 5 and 6, the sample 13 is glued onto an aluminium-backed printed circuit board 27 that serves both as a heat spreader and a microwave delivery structure. The sample 13 is located on top of an electrical short (not shown) between a conductive centre track (not shown) and ground plane of a coplanar waveguide (not shown), ensuring that the distance between the NV⁻ ensemble and microwave emitter is <0.3 mm.

An optical system 40 includes the signal delivery system 15 (herein referred to as a lens system) and the optical fibre 16. The lens system 15 is housed in a sensor head package 12. The fibre 16 both delivers the 532 nm laser excitation 19 and collects the laser induced fluorescence 19. The fibre 16 has a numerical aperture (N.A.) of 0.22 and a core diameter of 400 μm core diameter. It is terminated with a ceramic ferrule 41 held in a clamp 42 supported by substrate 43. The lens system 15 comprises in this case two lenses 44, 45 having focal lengths $f_1$=20 mm and $f_2$=8 mm respectively. The first lens 44 collimates the laser light 19 to a diameter of approximately 9 mm, and the second lens 45 focusses the light with an N.A.≈0.17. The second lens 45 collects the laser induced fluorescence 10 with an N.A. of 0.23, which is then focused into the fibre with an N.A. of 0.27, which results in a 20% loss due to the outermost rays of the fluorescence falling outside of the critical angle of the fibre. This arrangement achieves a higher numerical aperture in collection than excitation, allowing a larger volume of NV⁻ centres to be excited whilst still maintaining a high collection efficiency.

Referring to FIG. 3, as explained earlier, approximately 1% of the laser light is picked off by the beamsplitter 31 to form a reference beam which is reflected by mirror 31 onto one of the photodiodes PD2 of the balanced detector 20. The remainder of the laser light passes through shortpass dichroic mirror 33 and coupled into a fibre by lens 36. The fibre guides the laser excitation to the sensor head 12, inducing photoluminescence (PL) which is guided back via the same fibre. The photoluminescence is collimated out of the fibre by lens 36, and reflected by the dichroic mirror 33. The photoluminescence is reflected by mirror 35 through a longpass filter 34 to reject unwanted laser light leaking through into the detection arm. Lens 36 focusses the photoluminescence onto the other photodiode PD1 of the balanced detector. The balanced detector amplifies the difference of the signals from the two photodiodes.

The sensor head package 12 preferably includes a bias magnetic field source 46, for example, in the form of a permanent bar magnet. A bias magnetic field of, for example 0.5 to 2 mT, can help to split energy levels and so increase sensitivity.

Between 0.3 and 1 mW of fluorescence is incident on the first photodiode PD1 (FIG. 2) which produces a 2.5 V signal in the absence of microwaves. From this, the number of NV⁻ centres contributing to the signal is estimated to be on the order of $10^8$ assuming a radiative lifetime of 12 ns, suggesting a large contribution from NV⁻ centres exterior to the focal spot itself. Such a large number of centres is desirable for higher sensitivity; however, the potential spatial resolution is 4 μm instead of 1 μm owing to the large fibre core size diameter. Through the choice of a smaller core size, the spatial resolution may be enhanced at the expense of the photon detection rate (sensitivity).

The sample 13 generally takes the form of a block or slab of material. For example, the sample may have a thickness t of between 0.1 to 0.3 mm, but can be thicker or thinner or a different shape such as a hemisphere. The sample 13 may have a width w and length l, or diameter d of about around between 0.5 and 2 mm. The volume V of the sample 13 is may be between 10 μm³ and 2 mm³. Preferably, the volume is small (e.g., of the order of magnitude of 10 μm³ or 100 μm³) so as to reduce costs. The sample 13 is preferably monocrystalline. However, it may be polycrystalline.

Increasing Optical Intensity

Optical intensity of the laser excitation and the subsequent laser induced fluorescence can be increased using one or more features.

Figure 7:
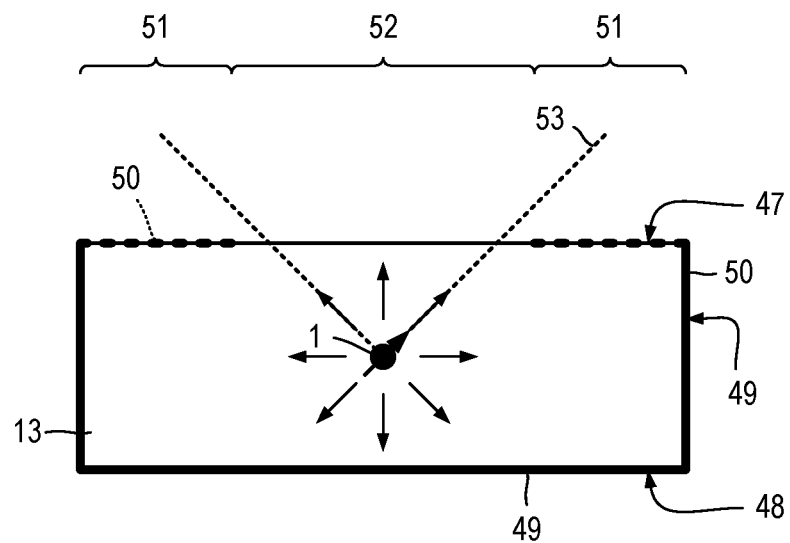
FIG. 7 illustrates a sample having a reflective structure.

Referring to FIG. 7, the sample 13 (in the form of a slab of diamond) has a principal surface 47 (or "face") through which laser light is directed and other surfaces 48, 49, which may take the form of an opposite face 48 and side faces 49. Some, preferably all, of the other surfaces 49 are provided with a reflective structure 50. Optionally, a peripheral edge portion 51 of the principal surface 47 may also be coated leaving a window 52.

The reflective structure 50 preferably takes the form of a reflective coating, formed of suitable material, such as titanium (Ti) or silver (Ag), with a thickness between 100 nm and 1 μm, which retroreflects un-absorbed laser light and some of the fluorescence emitted outside of the lens system's acceptance angle 53 that would otherwise escape before photodetection. The reflective coating may comprise a single layer of material or multiple layers (e.g., a bi-layer or tri-layer), for example, comprising first and second alternating layers of different materials. A tri-layer may comprise titanium, silver and gold. For example, a thin 5 nm layer of titanium may be deposited onto the diamond as a sticking later. A thicker 1 μm layer of silver may then be used as this has good reflectivity for green and red light and silver is cheaper than titanium. Finally, a capping layer such as gold may be used to prevent the silver from oxidizing. The principal surface 47 may similarly be metalized in an annular region 51 around the periphery, with a window 52 (such as a circular or rectangular window) left un-metalized to allow optical excitation and detection through this window.

The reflective structure 29 may comprise a grating or other structure formed on the surfaces 27, 28. The reflective structure 29 may take the form of a surface pattern, such a grating, i.e., the surface 27, 28 are patterned.

Figure 8:
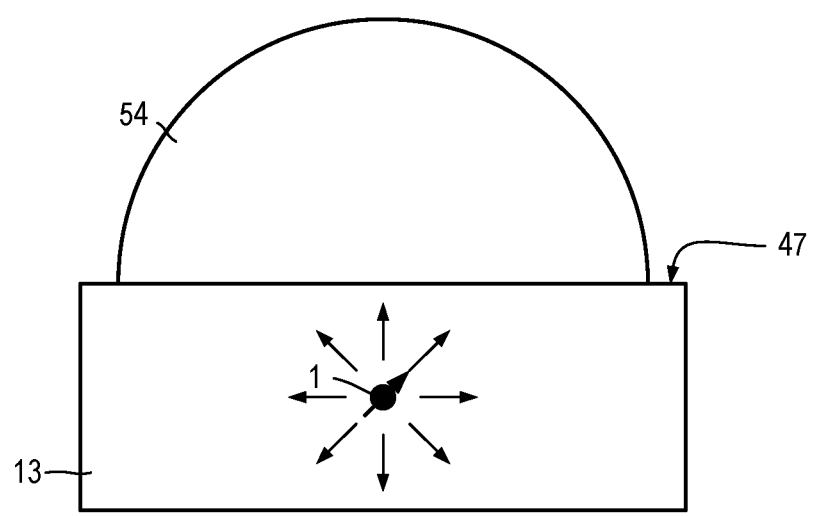
FIG. 8 illustrates a sample provided with a solid immersion lens.

Referring to FIG. 8, the sample 8 may be provided with a solid immersion lens 54 on the principal surface 47 of the diamond 13 to increase the effective numerical aperture of the system, and to reduce the reflection of excitation and florescence light at the air/diamond interface. The solid immersion lens 54 may be formed of the same material as the material containing the defects (i.e., the sample 13). Preferably, the solid immersion lens 54 and sample 13 are single piece. A work piece (not shown) may be machined, e.g., using focused ion beam or reactive ion etching, to form the single piece. The diameter of the solid immersion lens 54 preferably lies in a range between 1 to 500 microns.

Using one or more of these features, the diamond magnetometer can achieve sub-nT/√Hz sensitivity with a small and mobile fibre-coupled sensor head. Such a sensor can be used in a wide variety of applications, such as detecting corrosion of steel pipes in high radiation environments (i.e., where the levels of ionizing radiation are high, e.g., exceeding 50 mSv per year, exceeding 5 Sv per year or exceeding even 5 Sv per hour) and for medical applications such as magnetocardiography.

Applications

Non-Destructive Testing of Steel in Radioactive Environments

Diamond is radiation hard. Thus, an advantage of separating the control instrumentation and optics from the sensor head using an optical fibre and coaxial cable is to avoid components which might otherwise be susceptible to damage from being exposed to ionising radiation. Hollow-core fibre can be used to extend the ability of the sensor head to withstand radiation.

Thus, the magnetometer herein described can be used to find corrosion, cracking, and damage in steel structures (such as pipes) in environments with high radioactivity, such as nuclear reactors and nuclear waste storage.

Magnetocardiography

The detection of magnetic fields produced by the cardiac cycle is known as magnetocardiography (MCG). It is the magnetic analogue of electrocardiography (ECG). The benefit of MCG is that the magnetic field from the heart is not distorted by the body. ECG signals are also affected by the positioning and contact quality of the electrodes, whereas an MCG sensor does not require contact. A fibre-coupled diamond sensor can have the benefit of having a light and mobile sensor head, or array of sensors, that can easily be placed on the patient in a variety of settings such as at the hospital bed side, or inside a magnetically shielded room, and the control unit can remain outside so as to not adversely affect the function of the shielding. Other possible uses of MCG systems are integration into seating and beds for preventative medical applications. Seats and beds are ideal locations for MCG systems as they are close to the patients back or chest, and by extension, the heart. A car seat containing an MCG system would be able to detect a unique cardiac signature of the car owner as an alternative to fingerprint or iris scans Magnetic Induction Tomography Magnetic induction tomography (MIT) can be used for probing samples in which an AC or pulsed magnetic field is applied to the sample, and the magnetic response of the sample is recorded with a magnetometer. It is desirable to be able to apply a strong magnetic field, so as to be able to induce a strong response from the sample. However, all of the sensitive magnetometers used so far (such as atomic vapour cells, fluxgates and SQUIDs) have poor dynamic range (e.g., below the typical magnetic field of the Earth, which is around 0.065 mT). Some sensitive magnetometers (such as SQUIDs) stop working in a large magnetic field, while the others become insensitive to magnetic fields. This has held back the full potential of MIT.

An NV-centre diamond magnetometer such as that herein described is particularly suited to MIT due to the large dynamic range of NV magnetometry (e.g. 1 T). This can allow collection of data throughout the application of large AC or pulsed magnetic fields to the sample. A pulsed magnetic field of between 1 and 10 mT is preferred as it is large enough to induce a large response from the sample, but not so large that it is difficult to produce.

Furthermore, MIT fundamentally is a technique which requires the detection of magnetic fields at frequencies above DC. In practice, frequencies above 100 Hz would be most useful. While some magnetometers have sensitivity that is just as good or better at DC compared to AC, NV magnetometers such as that herein described have better sensitivity at higher frequencies because they can suffer from 1/f noise (even with a lock-in amplifier), and there are techniques to make them sensitive to only the specific frequency of interest (i.e., the frequency of the MIT excitation), so that only noise at that frequency is problematic.

AC magnetometry with NV magnetometers employing so-called "QDyne" (or "coherently averaged synchronized readout" or a "quantum lock-in") can be used. This can help improve sensitivity and greatly improve frequency resolution. Reference is made to S. Schmitt et al.: "Submillihertz magnetic spectroscopy performed with a nanoscale quantum sensor", Science, volume 356, pp. 832 to 837 (2017).

Modifications

It will be appreciated that various modifications may be made to the embodiments hereinbefore described. Such modifications may involve equivalent and other features which are already known in the design, manufacture and use of magnetometers and component parts thereof and which may be used instead of or in addition to features already described herein. Features of one embodiment may be replaced or supplemented by features of another embodiment.

A fibre having a numerical aperture lying in a range between 0.01 and 1.5 can be used. Preferably, the numerical aperture may have a value of between 0.05 and 0.5.

The material may be a material which exhibits ODMR, such as pentacene, and defects in or on the surface of crystals, amorphous solids, polycrystalline materials or epitaxial layers. Suitable materials include diamond, silica, zinc selenide and silicon carbide. The defect in diamond may be a $NV^-$, silicon vacancy ($SiV^-$ and $SiV^0$), germanium vacancy ($GeV^-$) and tin vacancy ($SnV^-$). The defect in quartz may be a self-trapped exciton. The defect in ZnS may be an A-centre acceptor. The defect in SiC may be a silicon vacancy defect and a neutral carbon-silicon divacancy in the 4H polytype and a divacancy (such as a chemically-bound silicon vacancy and carbon vacancy) in the 6H polytype.

If diamond is used, diamond can be isotopically purified to enrich C12 and reduce C13. This can be used to improve the sensitivity.

Pulsed mode operation can be used instead of continuous-wave (CW) operation. Pulsed mode operation does not require a lock-in amplifier. A system using pulsed mode operation preferably uses a higher laser power and a higher microwave power (compared to a system using CW operation). For example, a 532 nm laser power above 1 W and a microwave power above 1 W are preferably used. Pulsed mode can improve sensitivity in several ways. The initialisation and detection of the NV spin state occur when the laser on, but the magnetic field detection occurs when the laser is off; this can help reduce noise. Additionally, pulsed mode allows the sensor to be sensitive to particular frequencies, with lower noise because noise at other frequencies is rejected. This technique is called "dynamic decoupling spectroscopy".

The system can be fibre-based without a free-space propagation which may help to reduce the effect of vibration. The system may be partly fibre-based and partly free-space.

The system may include an array of sensors. For example, the sensor head may house an array (e.g., a rectangular or hexagonal array) of active elements. Each active element in an array may in optical communication with a respective optical waveguide. Alternatively, a single active element may provide an array of spaced apart regions. These regions may be defined by using local excitation in different regions of the active element and/or by using an array or apertures or solid immersion lens. A single fibre may be used to access an array of active elements or an array of regions in an active element, for example, using scanning mirrors.

Excitation may be performed non-optically, e.g., electrically. For example, the sample may be electrically pumped and luminesce may be measured. Conversely, measurement may be performed non-optically, e.g. electronically. For example, the sample may be excited optically and measured electrically. Electrical pumping and electrical measurement may be carried out using at least two electrical contacts to the sample and a suitable signal generator and analyser (e.g., parameter analyser).

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A defect centre-based sensor comprising:
   instrumentation which includes:
      a generator for causing excitation in an active element; and
      a detector for measuring a transition in the active element, wherein the generator is an optical source and/or the detector is an optical detector;
   an optical waveguide; and
   a sensor head in communication with the source and/or the detector via the optical waveguide, the sensor head housing:
      the active element having at least one defect centre; and
      a signal delivery arrangement arranged to optically couple the optical waveguide to the active element.

2. A defect centre-based sensor imaging system comprising
   instrumentation which includes:
      at least one generator for causing excitation in an active element; and
      at least one detector for measuring a transition in the active element, wherein the at least one generator is (are) optical source(s) and/or the at least one detector is (are) optical detector(s);
   at least one optical waveguide; and
   a sensor head in communication with the source(s) and/or the detector(s) via the optical waveguide(s), the sensor head housing:
      an array of active element or an array of regions in an active element having at least one defect centre; and
      at least one signal delivery arrangement arranged to optically couple the optical waveguide(s) to the active element(s).

3. The sensor of claim 1, wherein the source is an optical source and the detector is an optical detector.

4. The sensor of claim 1, wherein the signal delivery arrangement comprises at least one lens and the at least one lens is selected from the group consisting of:
   transmissive lens(es),
   mirror lens(es),
   grating lens(es), and
   at least two lenses including a first lens for collimating light from the optical waveguide and a second lens for focusing light onto the active element.

5. The sensor of claim 1, wherein the active element has a surface arranged to receive light from the at least one lens and other surfaces, at least some of the other surfaces provided with a reflective structure for retroreflecting unabsorbed light.

6. The sensor of claim 5, wherein the surface is provided with a reflective structure around a peripheral edge of the surface to define a central window.

7. The sensor of claim 5, wherein the reflective structure comprises a coating.

8. The sensor of claim 7, wherein the coating is a metallic coating.

9. The sensor of claim 5, wherein the reflective structure comprises a grating.

10. The sensor of claim 1, further comprising:
    a solid immersion lens in direct contact with or formed in a single piece with the active element arranged to couple light from the at least one lens into the active element.

11. The sensor of claim 1, wherein the optical waveguide is a hollow-core optical fibre.

12. The sensor of claim 1, further comprising:
    a microwave source arranged to excite the active element; and
    a lock-in amplifier arranged to receive a signal from optical detector.

13. The sensor of claim 1, configured to operate in pulsed mode operation.

14. The sensor of claim 1, wherein the sensor head is remote from the instrumentation.

15. An article incorporating the sensor head of the sensor of claim 1, wherein the article is a piece of furniture, such as seat, chair or bed, a removeable part of a piece of furniture, such as a cushion, mattress or sheet, a wall or door, a camera, an accessory, such as a watch or jewelry, or communications device, such as a mobile phone or tablet computer.

16. An article incorporating the sensor head of the sensor of claim 1, wherein the article is piece of clothing or medical dressing.

17. A method of using the sensor of claim 1, the method comprising:
    deploying the sensor head in a location which is remote from the instrumentation.

18. The method of claim 17, wherein the location is subject to ionizing radiation in excess of 50 mSv per year.

19. The method of claim 17, wherein the location is a magnetically-shielded room.

20. A method of magnetic induction tomography, the method comprising:
    applying a time-varying magnetic field to a sample; and
    measuring an induced response from the sample using the sensor of claim 1.

* * * * *